US006825569B2

(12) United States Patent
Jiang et al.

(10) Patent No.: US 6,825,569 B2
(45) Date of Patent: Nov. 30, 2004

(54) BGA PACKAGE HAVING SUBSTRATE WITH PATTERNED SOLDER MASK DEFINING OPEN DIE ATTACH AREA

(75) Inventors: Tongbi Jiang, Boise, ID (US); Edward Schrock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/258,961

(22) Filed: Mar. 1, 1999

(65) Prior Publication Data

US 2001/0013642 A1 Aug. 16, 2001

Related U.S. Application Data

(62) Division of application No. 09/191,215, filed on Nov. 12, 1998, now Pat. No. 6,048,755.

(51) Int. Cl.[7] ........................ H01L 23/48; H01L 23/52; H01L 29/40

(52) U.S. Cl. ....................... 257/783; 257/780; 257/782; 257/784; 257/787; 257/702; 257/713

(58) Field of Search ................................ 257/783–784, 257/782, 780, 738, 702, 787, 713, 737

(56) References Cited

U.S. PATENT DOCUMENTS 5,216,278 A 6/1993 Lin et al. .................... 257/688
5,360,942 A * 11/1994 Hoffman et al. ........... 174/52.4
5,397,921 A 3/1995 Karnezos .................... 257/779
5,409,865 A 4/1995 Karnezos .................... 437/210
5,420,460 A 5/1995 Massingill .................. 257/693
5,663,593 A 9/1997 Mostafazadeh et al. ..... 257/666
5,674,785 A 10/1997 Akram et al.
5,729,432 A * 3/1998 Shim et al. ................. 361/690
5,734,198 A 3/1998 Stave ......................... 257/666
5,739,585 A * 4/1998 Akram et al. ............... 257/698
5,739,588 A * 4/1998 Ishida et al. ................ 257/782
5,741,622 A 4/1998 Arima ..................... 430/270.1
5,767,575 A 6/1998 Lan et al. ................... 257/701
5,770,347 A 6/1998 Saitoh et al. ............ 430/280.1
5,780,923 A 7/1998 Courtenay .................. 257/666
5,789,803 A 8/1998 Kinsman
5,796,586 A * 8/1998 Lee et al. ................... 361/748
5,804,880 A 9/1998 Mathew ...................... 257/779
5,893,726 A 4/1999 Farnworth et al.
5,915,169 A * 6/1999 Heo ........................... 438/118
5,920,118 A * 7/1999 Kong ......................... 257/684
6,013,948 A 1/2000 Akram et al.
6,020,629 A 2/2000 Farnworth et al.
6,048,755 A 4/2000 Jiang et al.
6,057,597 A 5/2000 Farnworth et al.

OTHER PUBLICATIONS

Roget's II, The New Thesaurus, 3rd Edition, Houghton Mifflin Company, 1995, p. 213.

Random House Webster's College Dictionary, Random House, New York, 1997, p. 297.

* cited by examiner

*Primary Examiner*—Nitin Parenkh
(74) *Attorney, Agent, or Firm*—Stephen A. Gratton

(57) ABSTRACT

A BGA package and a method of fabricating the BGA package is provided. The package includes a substrate having a first surface with a pattern of conductors thereon, and an opposing second surface with a die attach area thereon. A first solder mask is formed on the first surface with via openings to ball bonding pads on the conductors. A second solder mask is formed on the second surface with an opening on the die attach area. The opening in the second solder mask permits a die to be placed through the opening and adhesively bonded directly to the substrate. The die can then be wire bonded to the conductors and encapsulated in an encapsulating resin. In addition solder balls can be placed in the via openings and bonded to the ball bonding pads.

7 Claims, 6 Drawing Sheets

BGA PACKAGE HAVING SUBSTRATE WITH PATTERNED SOLDER MASK DEFINING OPEN DIE ATTACH AREA

CROSS REFERENCE TO RELATED APPLICATIONS

This application is a division of application Ser. No. 09/191,215, filed on Nov. 12, 1998 now U.S. Pat. No. 6,048,775.

FIELD OF THE INVENTION

This invention relates generally to semiconductor packaging and specifically to a method for fabricating BGA packages using a substrate having a patterned solder mask with an open die attach area.

BACKGROUND OF THE INVENTION

One type of semiconductor package is referred to as a BGA package. BGA packages were developed to provide a higher lead count, and a smaller foot print, than conventional plastic or ceramic semiconductor packages. A BGA package includes an area array of solder balls that permit the package to be surface mounted to a printed circuit board (PCB) or other electronic component.

One type of prior art BGA package 10 is illustrated in FIG. 1A. The BGA package 10 includes a substrate 12, a semiconductor die 16 mounted to the substrate 12, and an encapsulating resin 38 which encapsulates the die 16. As shown in FIG. 1B, the substrate 12 is initially a segment 32 of a panel 30. The panel 30 is similar to a lead frame used in the fabrication of conventional plastic semiconductor packages. The panel 30 includes multiple substrates 12 and is used to fabricate multiple BGA packages 10. Following the fabrication process for the BGA packages 10, the panel 30 is singulated into individual BGA packages 10.

Typically, the substrate 12 comprises a reinforced polymer laminate material, such as bismaleimide triazine (BT), or a polyimide resin. As shown in FIG. 1A, the substrate 12 includes a planar die attach surface 22. During a die attach step of the fabrication process, the die 16 is adhesively bonded to the substrate 12 using an adhesive layer 34.

In addition to the die attach surface 22, the substrate 12 includes an opposing conductor surface 24 wherein conductors 18 are formed in a required pattern. An opening 26 in the substrate 12 provides access for wire bonding wires 28 to the conductors 18, and to bond pads (not shown) on the die 16. In the type of BGA package 10 illustrated in FIG. 1A, the die 16 is adhesively bonded face down to the die attach surface 22, with the bond pads on the die 16 aligned with the opening 26. Following the wire bonding step, an encapsulating resin 38 such as a Novoloc based epoxy, is molded onto the substrate 12 to encapsulate the die 16. In addition, a glob top 40 or other encapsulant can be formed over the wires 28 for protection. In some types of BGA packages the die 16 is attached back side down to the substrate 12, and the wire bonded wires 28 are encapsulated in the encapsulating resin 38.

The substrate 12 also includes a solder mask 20A formed on the conductor surface 24 and on the conductors 18. The solder mask 20A includes a pattern of via openings 25, wherein an array of solder balls 14 are located. During a solder ball bonding step, the solder balls 14 are bonded to ball bonding pads 31 on the conductors 18. Typically, solder ball bonding is performed by applying flux to the ball bonding pads 31, and to the solder balls 14. The solder balls 14 are then placed in the via openings 25, and the assembly is placed in an oven wherein the solder is reflowed to form a metallurgical solder bond. The solder mask 20A comprises an electrically insulating, low surface tension material, which prevents bridging of the solder material, and shorting between the solder balls 14 in the completed BGA package 10. In addition, the solder mask 20A helps to position the solder balls 14 for the solder reflow process.

Typically, the solder mask 20A comprises a photoimageable material, that can be blanket deposited as a wet or dry film, exposed through a mask, developed and then cured. Wet films are preferred because of their moisture resistance and low cost. Exposure and development of the solder mask 20A forms the via openings 25 in a required pattern and with required diameters. In addition, exposure and development of the solder mask 20A removes the mask material from the conductors 18 in a wire bonding area 36, wherein the wires 28 are wire bonded to the conductors 18.

In addition to the solder mask 20A being formed on the conductors 18, a solder mask 20B is also formed on the die attach surface 22. In general, the panel 30 is constructed with the solder mask 20B on the die attach surface 22 because the mask material is initially blanket deposited on all exposed surfaces of the panel 30 to form the solder mask 20A. For example, a spray coater or a curtain coater, can be used to blanket deposit the mask material on both the die attach surface 22, and on the conductor surface 24 of the substrates 12.

The presence of the solder mask 20B on the die attach surface 22 of the substrate 12 can cause problems in the BGA package 10. Firstly, the adhesive layer 34 which bonds the die 16 to the die attach surface 22 must be formed on the solder mask 20B. In general the solder mask 20B has a smooth surface, and a low surface tension. Accordingly, the adhesive bond between the die 16 and the solder mask 20B can be substandard. This can cause the die 16 to pop loose from the die attach surface 22.

Secondly, the solder mask 20B has hydrophilic properties, and tends to attract moisture. In order to drive off the moisture, along with solvents and other volatile compounds, a prebaking step can be performed on the solder mask 20B. However, this extra process step is sometimes not sufficient to prevent trapped moisture in the completed BGA package 10. Thirdly, the solder mask 20B can delaminate from the substrate 12 causing cracks to form in the BGA package 10.

In view of these and other deficiencies in conventional methods for fabricating BGA packages, improvements in BGA substrates, and in fabrication methods for BGA packages, are needed in the art.

SUMMARY OF THE INVENTION

In accordance with the present invention, an improved method for fabricating BGA packages, and an improved substrate for fabricating BGA packages, are provided.

The method, simply stated, comprises forming a substrate having a solder mask that substantially covers both major surfaces thereof, but which is patterned to leave a die attach area on the substrate open. The open die attach area permits a semiconductor die to be bonded directly to the substrate, rather than to the solder mask. This improves adhesion of the die to the substrate, reduces trapped moisture, and prevents delamination of the solder mask in the die attach area.

The substrate can comprise an electrically insulating material, such as bismaleimide triazine (BT). Initially, the substrate can be a segment of a panel which can be used to fabricate multiple BGA packages. The substrate includes a pattern of conductors formed on a first surface thereof, and a die attach area formed on an opposing second surface thereof. A first solder mask is formed on the first surface, and includes a pattern of via openings for attaching solder balls to ball bonding pads on the conductors. A second solder mask is formed on the second surface, and includes openings on the die attach area, permitting the die to be adhesively bonded directly to the substrate.

In an illustrative embodiment, the die is adhesively bonded face down to the substrate. In addition, bond pads on the die are placed in electrical communication with a corresponding pattern of conductors on the substrate, by wire bonding through openings in the substrate. Alternately, a flip chip process, or tape automated bonding, can be used to establish electrical communication between the die and the conductors.

DETAILED DESCRIPTION OF THE PREFERRED EMBODIMENTS

Referring to FIGS. 2A–2E, a panel 42 containing a plurality of substrates 56 constructed in accordance with the invention is illustrated. In FIGS. 2A–2E, the panel 42 and substrates 56 are illustrated prior to formation of solder masks thereon.

Figure 7:
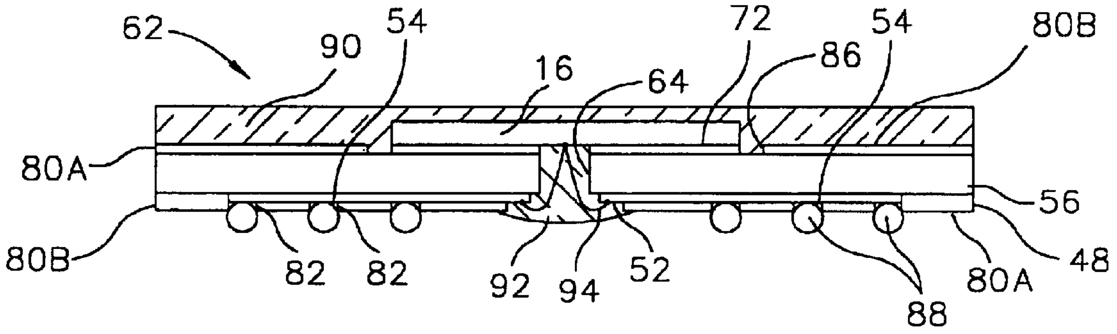
FIG. 7 is a schematic cross sectional view of the completed BGA package.

Each substrate 56 is a segment of the panel 42, and will subsequently be separated from the adjacent substrates 56 to form a BGA package 62 (FIG. 7). In the illustrative embodiment there are eighteen substrates 56 on the panel 42. However, this number is merely exemplary and the panel 42 can include a fewer or greater number of substrates 56. The panel 42 facilitates the fabrication process in that different operations, such as die attach, and wire bonding, can be performed at the same time on each of the substrates 56.

Figure 1A:
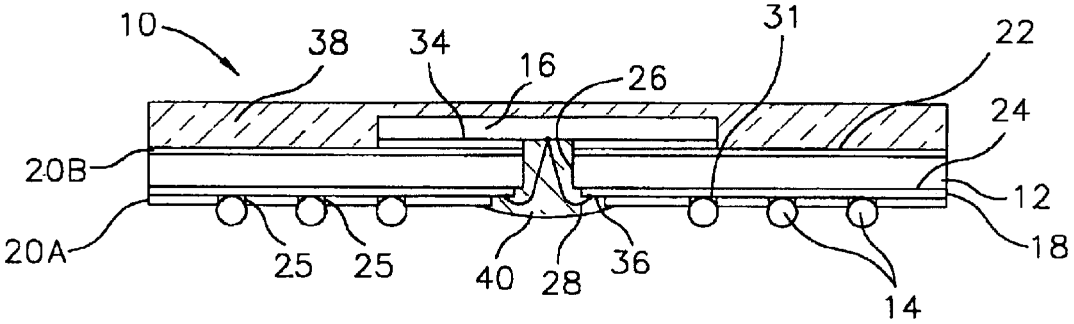
FIG. 1A is a schematic cross sectional view of a prior art BGA package taken along section line 1A—1A of FIG. 1B.
Figure 1B:
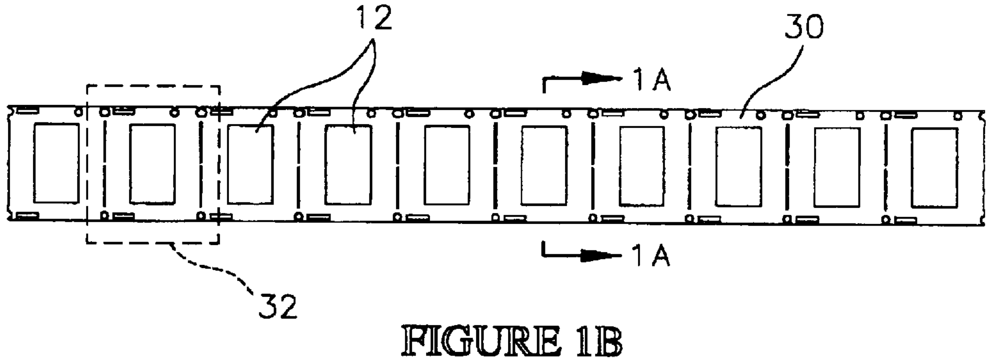
FIG. 1B is a plan view of a prior art panel containing a substrate for fabricating the BGA package shown in FIG. 1A.
Figure 2A:
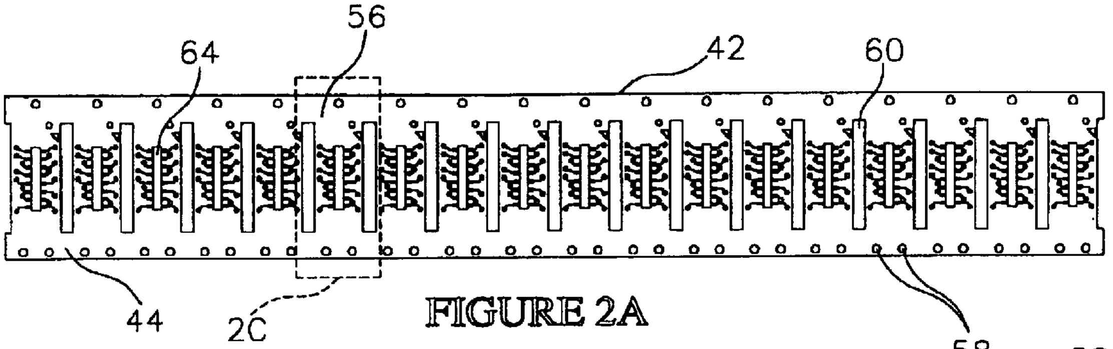
FIG. 2A is a plan view of a panel containing multiple substrates constructed in accordance with the invention prior to formation of solder masks on the substrates.
Figure 2B:
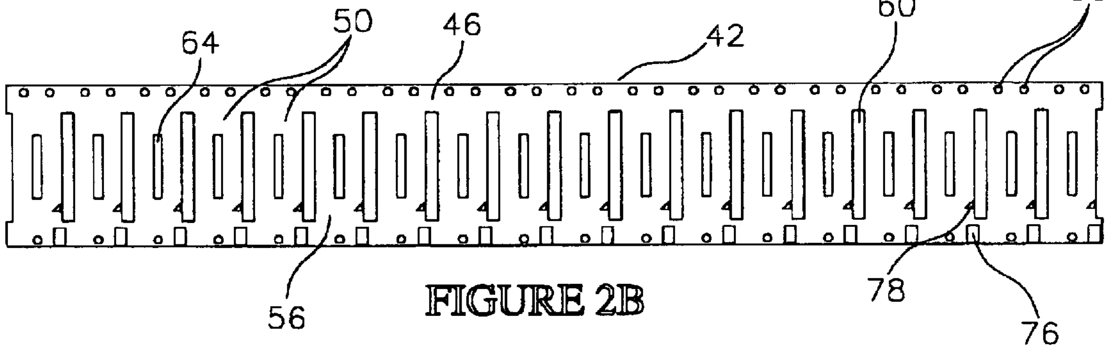
FIG. 2B is a bottom view of the panel.

Each substrate 56 includes a first surface 44 (FIG. 2A), and an opposing second surface 46 (FIG. 2B). The first surface 44, and the second surface 46, are the major planar surfaces of the substrates 56. Each substrate 56 also includes a pattern of conductors 48 formed on the first surface 44 thereof, and a corresponding die attach area 50 formed on the second surface 46 thereof.

The substrates 56 comprise an electrically insulating material such as an organic polymer resin reinforced with glass fibers. Suitable materials for the substrates 56 include bismaleimide-triazine (BT), epoxy resins (e.g., "FR-4" and "FR-5"), and polyimide resins. These materials can be formed with a desired thickness, and then punched, machined, or otherwise formed with a required peripheral configuration, and with required features. A representative thickness of the substrates 56 can be from about 0.2 mm to 1.6 mm.

As shown in FIG. 2A, the panel 42 includes circular indexing openings 58 formed through the substrates 56 and proximate to the longitudinal edges of the panel 42. The indexing openings 58 permit the panel 42 to be handled by automated transfer mechanisms associated with chip bonders, wire bonders, molds, and trim machinery. In addition, the panel 42 includes elongated separation openings 60 which facilitate singulation of the substrates 56 on the panel 42 into separate BGA packages 62 (FIG. 7). The substrates 56 also includes wire bonding openings 64 which provide access for wire bonding semiconductor dice 16 (FIG. 4A) to the patterns of conductors 48 on the substrates 56.

Figure 2C:
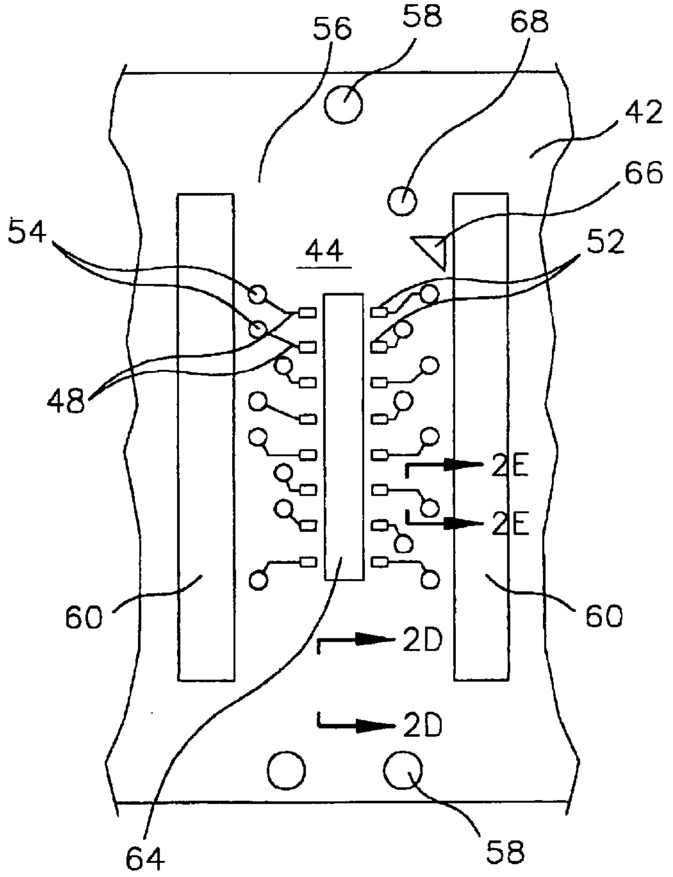
FIG. 2C is an enlarged portion of a substrate on the panel taken along section line 2C of FIG. 2A.
Figure 2D:
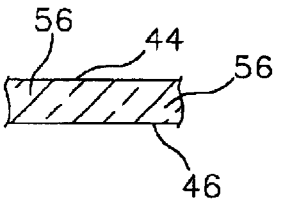
FIG. 2D is a cross sectional view of the substrate taken along section line 2D—2D of FIG. 2C.
Figure 2E:
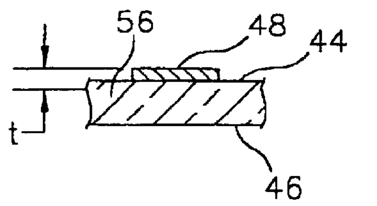
FIG. 2E is a cross sectional view of the substrate taken along section line 2E—2E of FIG. 2C.

Referring to FIG. 2C, a single substrate 56 and the conductors 48 on the substrate 56 are shown in greater detail. The conductors 48 initially comprise a highly conductive metal layer, which is blanket deposited onto the substrate 56 (e.g., electroless or electrolytic plating), and then etched in required patterns. Alternately, an additive process, such as electroless deposition through a mask, can be used to form the conductors 48 in required patterns. A preferred metal for the conductors 48 is copper. Other suitable metals for the conductors 48 include aluminum, titanium, tungsten, tantalum, platinum, molybdenum, cobalt, nickel, gold, and iridium. If desired, the substrate 56 and conductors 48 can be constructed from a commercially produced bi-material core, such as a copper clad bismaleimide-triazine (BT) core, available from Mitsubishi Gas Chemical Corp., Japan. A representative weight of the copper can be from 0.5 oz to 2 oz. per square foot.

As shown in FIG. 2C, each conductor 48 includes a wire bonding pad 52 and a ball bonding pad 54. The wire bonding pads 52 can subsequently be plated with metals such as nickel and gold to facilitate the wire bonding process. The ball bonding pad 54 can also subsequently be plated with a solder flux to facilitate attachment of solder balls 88 (FIG. 7) thereto.

As shown in FIG. 2C, the panel 42 also includes a triangular metal segment 66, and a circular metal segment 68 formed on the first surface 44. The metal segments 66, 68 can comprise a same metal as the conductors 48. The triangular shaped metal segment 66 functions as a pin #1 indicators. The circular metal segment 68 functions as an alignment fiducial. As shown in FIG. 2B, the panel 42 also includes a square metal segment 76 and a triangular metal segment 78 on the second surface 46. The square metal segment 76 function as a mold compound gate break. The triangular metal segment 78 functions as a pin #1 indicator.

Referring to FIGS. 3A–3D, steps in a method for forming a solder mask 80A (FIG. 3C) on the first surface 44 (FIG. 3A), and a solder mask 80B (FIG. 3C) on the second surface 46 (FIG. 3A) of the substrate 56 are illustrated. Although these steps are shown as being performed on a single substrate 56, it is to be understood that the steps are performed on each of the substrates 56 contained on the panel 42, substantially at the same time.

Figure 3A:
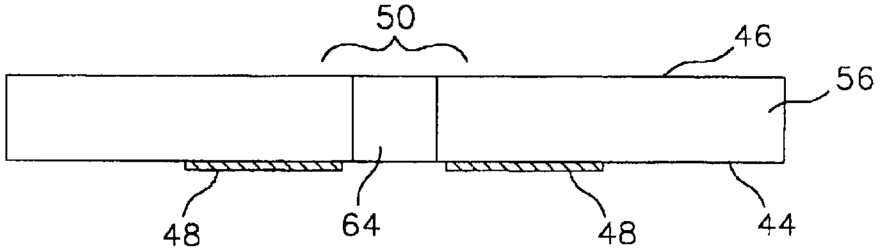
FIGS. 3A–3D are schematic cross sectional views illustrating process steps during fabrication of the substrate.

Initially, as shown in FIG. 3A, the substrate 56 can be provided with the conductors 48 on the first surface 44, and the die attach area 50 on the second surface 46, substantially as previously described and shown in FIGS. 2A–2E. In addition, the die attach area 50 can include the wire bonding opening 64 formed through the substrate 56 to the patterns of conductors 48.

Figure 3B:
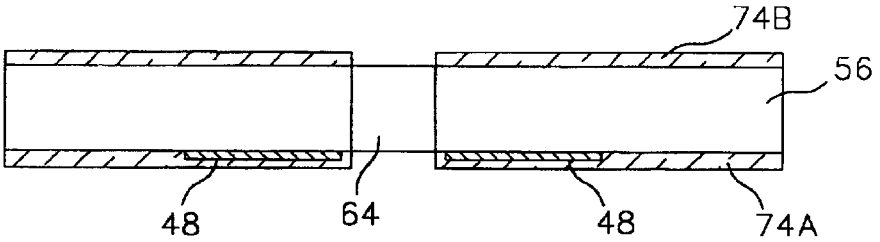

As shown in FIG. 3B, a mask material 74A is blanket deposited on the first surface 44 and substantially covers the first surface 44. Similarly, a mask material 74B is blanket deposited on the second surface 46 and substantially covers the second surface 46 and conductors 48. Preferably, the mask materials 74A, 74B comprise a photoimageable dielectric material, such as a negative or positive tone resist. One suitable resist is commercially available from Taiyo America, Inc., Carson City, Nev. under the trademark "PSR-4000". The "PSR-4000" resist can be mixed with an epoxy such as epoxy "720" manufactured by Ciba-Geigy (e.g., 80% PSR-4000 and 20% epoxy "720"). Another suitable resist is commercially available from Shipley under the trademark "XP-9500".

The mask materials 74A, 74B can be blanket deposited onto the substrate 56 using a suitable deposition process, such as by spraying the mask materials 74A, 74B through a nozzle onto the substrate 56, or by moving the substrate 56 through a curtain coater conveyor having curtains of mask materials 74A, 74B. A representative thickness of the mask materials 74A, 74B can be from about 1 mils to 4 mils. A representative weight of the mask materials 74A, 74B can be from about 0.32 oz–0.42 oz (9–12 grams) per square foot.

Following blanket deposition of the mask materials 74A, 74B, a prebaking step can be performed to partially harden the mask materials 74A, 74B. For example, the mask materials 74A, 74B can be "prebaked" at about 95° C. for about 15 minutes. Following prebaking, the mask materials 74A, 74B can be exposed in a desired pattern using a suitable mask, and a conventional UV aligner. A representative UV dose can be about 165 mJ/$cm^2$.

Following exposure of the mask materials 74A, 74B a developing step can be performed. The developing step can be performed using a suitable developing solution such as a 1 to 1.5 percent solution of sodium monohydrate ($Na_2CO_3$—$H_2O$), or potassium carbonate monohydrate ($K_2CO_3$—$H_2O$). Following the developing step, the mask materials 74A, 74B can be rinsed, dried and cured. Curing can be performed by exposure to UV at a desired power (e.g., 3–5 J/$cm^2$), or by heating to a desired temperature (e.g., 150–155° C.) for a desired time (e.g., one hour).

Figure 3C:
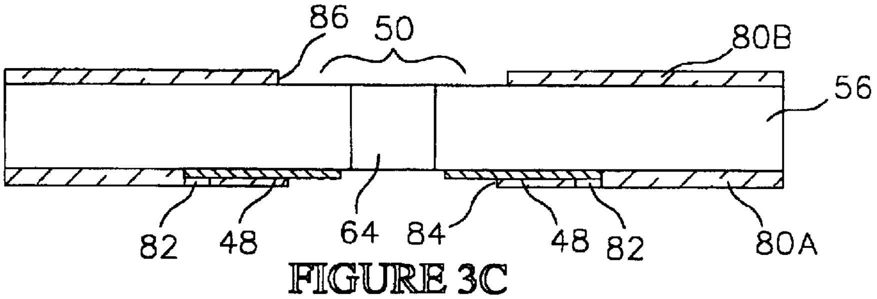

As also shown in FIG. 3C, exposing and developing the mask material 74B forms the solder mask 80B on the second surface 46 of the substrate 56. The solder mask 80B includes a die attach opening 86 having an outline corresponding to but only slightly larger than the outline of the semiconductor die 16.

As also shown in FIG. 3C, exposing and developing the mask material 74B forms the solder mask 80B on the second surface 46 of the substrate 56. The solder mask 80B includes a die attach opening 86 having an outline that is slightly larger than the outline of the semiconductor die 16. The die attach opening 86 defines the die attach area 50 on the substrate 56.

Figure 3D:
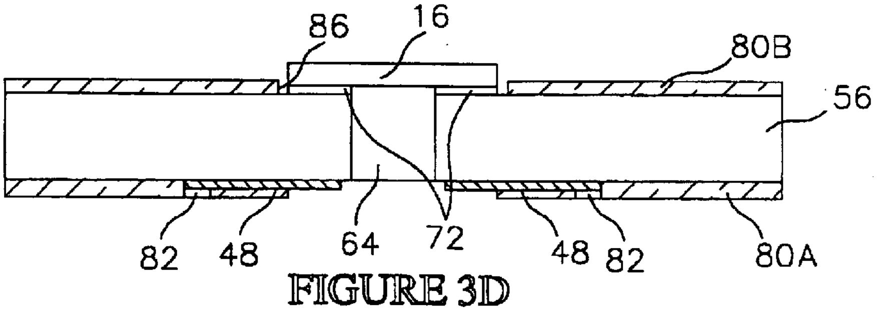

As shown in FIG. 3D, the die attach opening 86 permits the die 16 to be placed there through, and bonded directly to the substrate 56 using an adhesive layer 72. The adhesive layer 72 can comprise a filled epoxy, an unfilled epoxy, an acrylic, or a polyimide material. A conventional die attacher can be used to form the adhesive layer 72 and adhesively bond the die 16 to the substrate 56.

Figure 4:
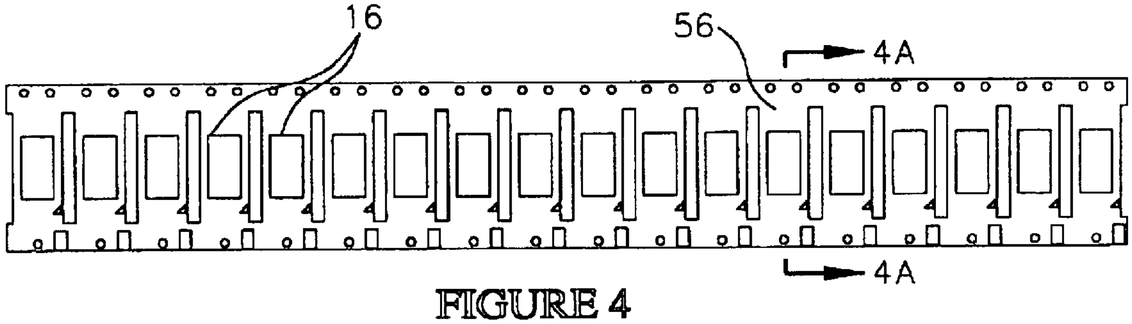
FIG. 4 is a bottom view of a panel containing multiple substrates and dice, with each substrate fabricated using the steps shown in FIGS. 3A–3D.
Figure 4A:
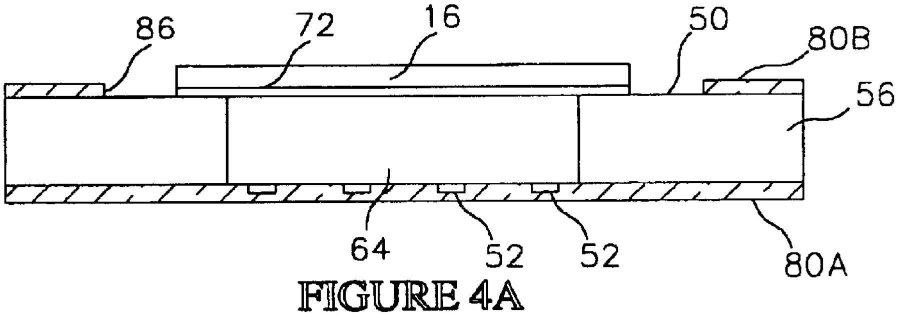
FIG. 4A is an enlarged cross section view taken along section line 4A—4A of FIG. 4 showing a semiconductor die adhesively bonded to a substrate on the panel.

In FIGS. 4 and 4A, the panel 42 is illustrated following formation of the solder masks 80A and 80B, and following attachment of the dice 16 to the substrates 56. As previously stated, the die attach openings 86 permit the dice 16 to be bonded directly to the substrates 56. Bonding the dice 16 directly to the substrates 56, rather than to a solder mask, as in the prior art, provides the following benefits.

1. Improved adhesion of the die 16 to the substrate 56 in the completed package 62 (FIG. 7).
2. Improved heat transfer between the die 16 and the substrate 56 in the completed package 62 (FIG. 7).
3. Less trapping of moisture between the die 16 and the substrate 56.
4. No possibility of the solder mask 80B delaminating from the substrate 56 in the die attach area 50, as the solder mask 80B is open in this area.

Figure 5:
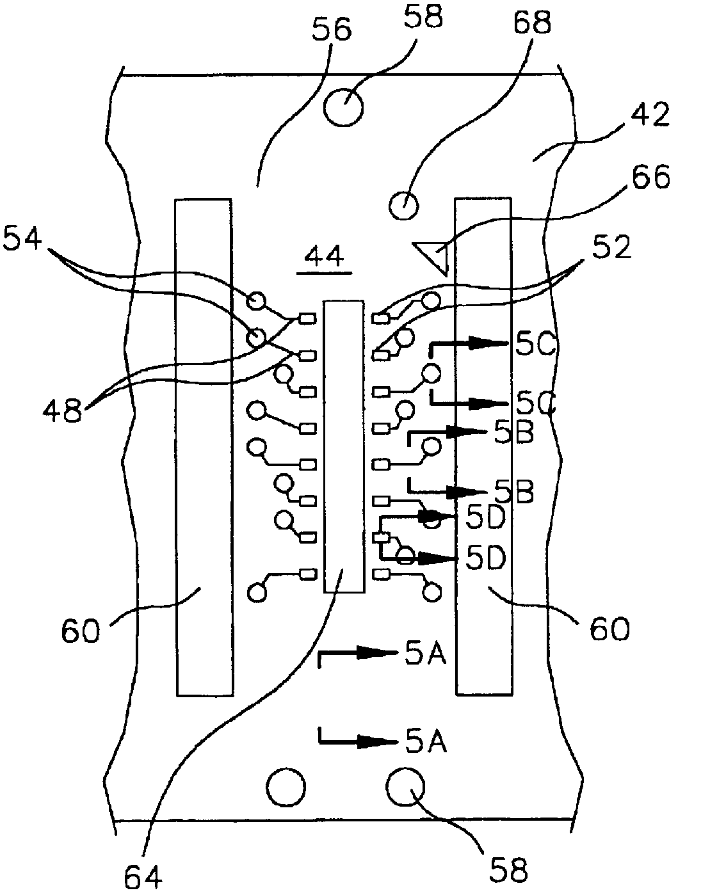
FIG. 5 is an enlarged plan view of the substrate on the panel.
Figure 5A:
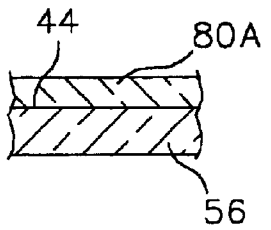
FIG. 5A is an enlarged cross sectional view of the substrate taken along section line 5A—5A of FIG. 5.
Figure 5B:
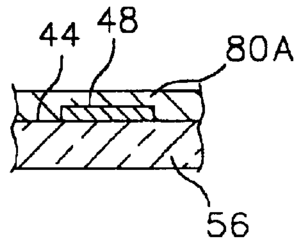
FIG. 5B is an enlarged cross sectional view taken along section line 5B—5B of FIG. 5 showing a conductor on the substrate.
Figure 5C:
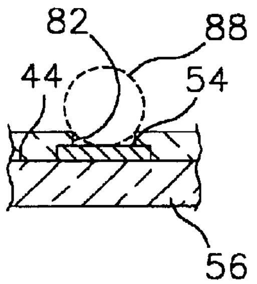
FIG. 5C is an enlarged cross sectional view taken along section line 5C—5C of FIG. 5 showing a ball bonding pad on the substrate.
Figure 5D:
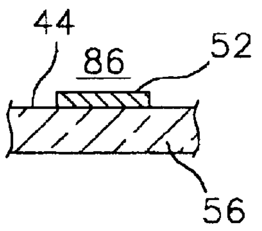
FIG. 5D is an enlarged cross sectional view taken along section line 5D—5D of FIG. 5 showing a wire bonding pad on the substrate.

In FIGS. 5–5D, the substrate 56, and the first surface 44 thereof, are illustrated following formation of the solder mask 80A thereon. As shown in FIG. 5A, the solder mask 80A substantially covers the first surface 44 of the substrate 56. As shown in FIG. 5B, the solder mask 80A also substantially covers the conductors 48 on the substrate 56. As shown in FIG. 5C, the solder mask 80A includes via openings 82 to the ball bonding pads 54 on the conductors 48. As shown in FIG. 5D, the openings 84 in the solder mask 80A exposes the wire bonding pads 52 of the conductors 48 for wire bonding.

Figure 6A:
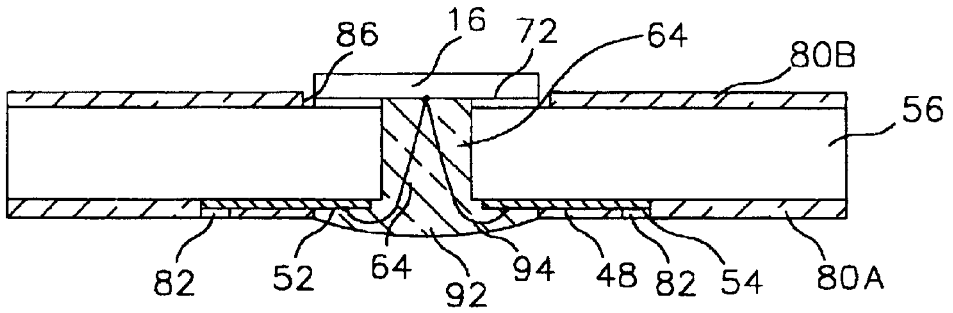
FIGS. 6A–6B are schematic cross sectional views illustrating steps during fabrication of a BGA package using the substrate.
Figure 6B:
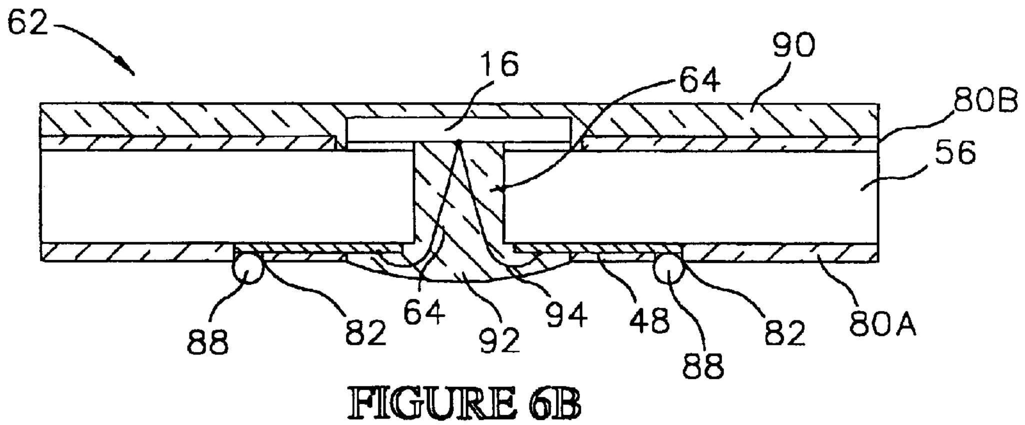

Referring to FIGS. 6A–6B steps in a method for fabricating the BGA package 62 (FIG. 7) using the substrate 56 with the solder masks 80A, 80B thereon, are illustrated. As before these steps are shown being performed on a single substrate, although in actual practice the steps will be performed on multiple substrates 56 contained on the panel 42 (FIG. 2A).

As shown in FIG. 6A, following attachment of the die 16 to the substrate 56, wires 94 can be wire bonded to the wire bonding pads 52, and to corresponding bond pads on the die 16. A conventional wire bonder can be used to perform the wire bonding step. Alternately, instead of wire bonding, a flip chip process (e.g., C4), or a TAB bonding process, can be used to electrically connect the die 16 to the conductors 48. In addition, although in the illustrative embodiment, the die 16 is mounted face down to the substrate 56, the die 16 can alternately be back bonded to the substrate 56, and wire bonded to conductors located on a same surface of the substrate 56 as the die 16.

As also shown in FIG. 6A, following wire bonding, an encapsulating resin 90 can be formed on the die 16 and on the substrate 56. The encapsulating resin 90 can comprise a Novolac based epoxy formed in a desired shape using a transfer molding process, and then cured using an oven. Also, if desired, a glob top 92 can be formed on the wires 94.

As shown in FIG. 6B, following formation of the encapsulating resin 90, solder balls 88 can be bonded to the ball bonding pads 54 of the conductors 48. A solder reflow process can be used to bond the solder balls 88 to the ball bonding pads 54. Prior to the solder reflow process, solder flux can be deposited on the ball bonding pads 54 and on the solder balls 88. The solder balls 88 can then be placed on the ball bonding pads 54, and a furnace used to form metallurgical solder joints between the solder balls 88 and the ball bonding pads 54. During bonding of the solder balls 88, the via openings 82 in the solder mask 80A facilitate alignment of the solder balls 88 to the ball bonding pads 54. In addition, in the completed BGA package 62, the solder mask 80A insulates adjacent solder balls 88 and insulates the conductors 48 from the solder balls.

Referring to FIG. 7, the BGA package 62 fabricated using the substrate 56 is illustrated. The BGA package 62 includes the semiconductor die 16 bonded directly to the substrate 56. The opening 86 in the solder mask 80B allows the die 16 to be bonded directly to the substrate 56. In addition, the BGA package 62 includes solder balls 88 placed through the via openings 82 in solder mask 80A and bonded to the ball bonding pads 54 on the conductors 48. Further, the BGA package 62 includes the encapsulating resin 90 which encapsulates the die 16. Still further, the BGA package 62 includes wires 94 wire bonded to the die 16 and to wire bonding pads 52. The BGA package 62 also includes the glob top 92 encapsulating the wires 94.

Steps in a method for fabricating the BGA package 62 can be summarized as follows.

1. Providing the substrate 56 with the first surface 44 and the second surface 46.
2. Providing the pattern of conductors 48 on the first surface 44. Each conductor 48 including the wire bonding pad 52 and the ball bonding pad 54.
3. Providing the die attach area 50 on the second surface 46 of the substrate 56.
4. Depositing the photoimageable mask material 74A on the first surface 44 and on the conductors 48.
5. Depositing the photoimageable mask material 74B on the second surface 46 and on the die attach area 50.
6. Exposing and developing the mask material 74A on the first surface 44 to form the first solder mask 80A having the via openings 82 to the ball bonding pads 54, and the opening 84 to the wire bonding pads 52.
7. Exposing and developing the mask material 74B on the second surface 46 to form the second solder mask 80B having the opening 86 to the die attach area 50.
8. Placing the semiconductor die 16 through the opening 86 in the die attach area 50.
9. Attaching the die 16 to the die attach area 50 using the adhesive layer 72.
10. Wire bonding wires 94 to the die 16 and to the wire bonding pads 52 on the conductors 48.
11. Forming the encapsulating resin 90 on the die 16 and the substrate 56.
12. Bonding solder balls 88 to the ball bonding pads 54 with the solder mask 80A locating and insulating the solder balls 88.
13. With the substrate 56 contained on the panel 42 a singulating step can be performed by cutting, shearing or punching the substrate 56 from the panel 42.

Thus the invention provides a method for fabricating BGA packages using a substrate having a solder mask that is open in die attach areas. Although the invention has been described with reference to certain preferred embodiments, as will be apparent to those skilled in the art, certain changes and modifications can be made without departing from the scope of the invention, as defined by the following claims.

We claim:

1. A semiconductor package comprising:

a substrate having a first surface and a second surface;

a semiconductor die having a first outline and a face having an active surface bonded directly to the second surface;

a first mask on the first surface;

a second mask on the second surface comprising a second opening having a second outline corresponding to the first outline defining an open die attach area on the second surface;

the first mask and the second mask comprising a photoimageable material; and a resin encapsulating the die and covering a top surface of the second mask.

2. The package of claim 1 further comprising a filled adhesive layer between the face and the die attach area bonding the die to the substrate and configured to transfer heat directly from the face to the substrate.

3. The package of claim 1 wherein the second outline is only slightly larger than the first outline.

4. A semiconductor package comprising:

a substrate having a first surface, a second surface and a bonding opening there through;

a plurality of conductors on the first surface having a plurality of wire bonding pads;

a first mask on the first surface at least partially covering the conductors;

a second mask on the second surface except in a die attach area defined by an opening in the second mask;

the first mask and the second mask comprising a photoimageable material;

a semiconductor die on the die attach area having a face with an active surface aligned with the bonding opening attached directly to the second surface;

a filled adhesive layer attaching the face directly to the die attach area and configured to transfer heat directly from the face to the substrate;

a plurality of wires in the bonding opening bonded to the die and to the wire bonding pads; and a resin encapsulating the die and covering a top surface of the second mask.

5. The package of claim 4 wherein the die attach area has an outline only slightly larger than that of the die.

6. The package of claim 4 wherein the substrate comprises an organic polymer.

7. The package of claim 4 wherein the adhesive layer comprises a material selected from the group consisting of epoxy, acrylic and polyimide.

* * * * *